United States Patent
Kim et al.

(10) Patent No.: US 12,398,292 B2
(45) Date of Patent: Aug. 26, 2025

(54) METHOD FOR PREPARING POLISHING SLURRY AND POLISHING METHOD USING SAME

(71) Applicant: RESEARCH & BUSINESS FOUNDATION SUNGKYUNKWAN UNIVERSITY, Suwon-si (KR)

(72) Inventors: Taesung Kim, Seoul (KR); Seokjun Hong, Siheung-si (KR); Sanghyeon Park, Gunpo-si (KR); Jaewon Lee, Yongin-si (KR); Hyeonmin Seo, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 690 days.

(21) Appl. No.: 17/575,433

(22) Filed: Jan. 13, 2022

(65) Prior Publication Data
US 2022/0220341 A1    Jul. 14, 2022

(30) Foreign Application Priority Data

Jan. 13, 2021 (KR) .................. 10-2021-0004610
Nov. 2, 2021 (KR) .................. 10-2021-0148998

(51) Int. Cl.
| | | |
|---|---|---|
| *C09G 1/02* | (2006.01) | |
| *H01L 21/00* | (2006.01) | |
| *H01L 21/04* | (2006.01) | |
| *H01L 21/306* | (2006.01) | |
| *H01L 21/31* | (2006.01) | |
| *H01L 21/3105* | (2006.01) | |

(52) U.S. Cl.
CPC ............ *C09G 1/02* (2013.01); *H01L 21/0445* (2013.01); *H01L 21/30625* (2013.01); *H01L 21/31053* (2013.01)

(58) Field of Classification Search
CPC . C09G 1/02; H01L 21/0445; H01L 21/30625; H01L 21/31053; C09K 3/1463
See application file for complete search history.

(56) References Cited

FOREIGN PATENT DOCUMENTS

| JP | 2017112207 A | * 6/2017 | ............ B24B 55/12 |
|---|---|---|---|
| KR | 10-0641348 B1 | 11/2006 | |
| KR | 10-2011-0042622 A | 4/2011 | |

(Continued)

OTHER PUBLICATIONS

Rahimi M. et al. CFD modeling of permeate flux in cross-flow microfiltration membrane. Journal of Membrane Science, 255, 23-31. (Year: 2005).*

(Continued)

*Primary Examiner* — Amber R Orlando
*Assistant Examiner* — Anastasia A. Kuvayskaya
(74) *Attorney, Agent, or Firm* — NSIP Law

(57) ABSTRACT

The present application relates to a method for preparing a polishing slurry, the method including the steps of preparing a solution containing abrasive particles and a fluid, passing the solution through a porous membrane filter region, and preparing a polishing slurry by removing the fluid from the solution that has passed through the region, in which in the step of passing the solution through the region, those with a mean particle size of 100 nm or less among the abrasive particles are removed by a tangential flow filtration method.

10 Claims, 15 Drawing Sheets

(56) References Cited

FOREIGN PATENT DOCUMENTS

TW           202045310 A  * 12/2020
WO    WO-2021024899 A1  *  2/2021   ............ B01D 69/02

OTHER PUBLICATIONS

JP 2017112207 A, Translation (Year: 2017).*
TW 2020045310 A, Translation (Year: 2020).*
WO 2021024899 A1, Translation (Year: 2021).*

* cited by examiner

Tangential (Cross) Flow Filtration

[Fig. 3]

Dead-End Filtration

[Fig. 5]
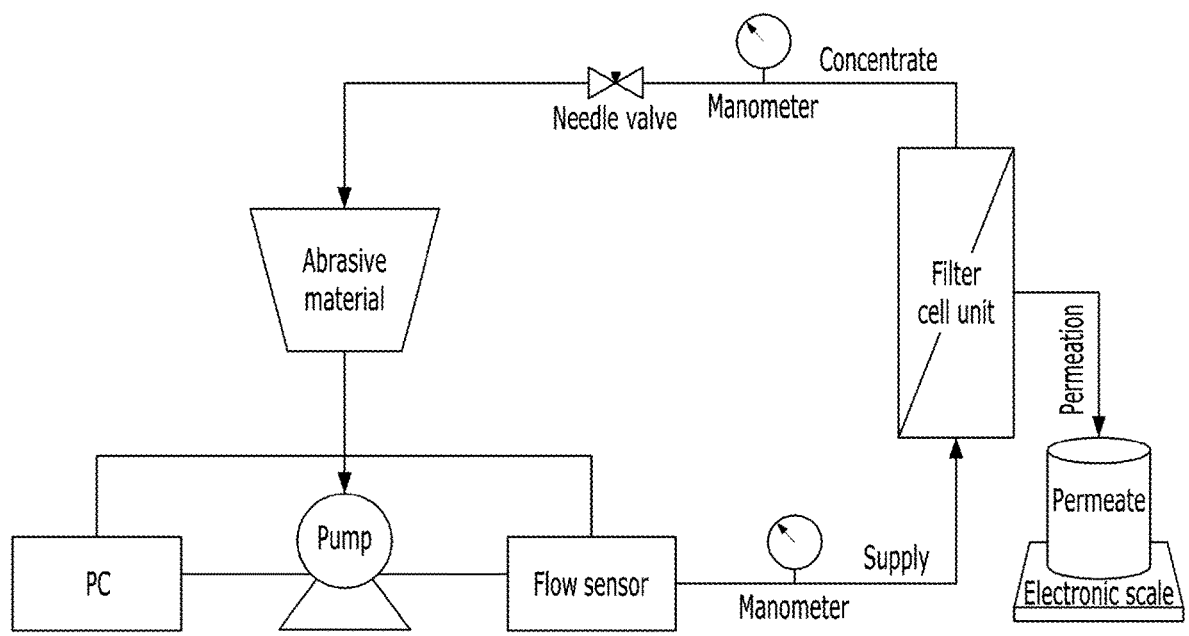

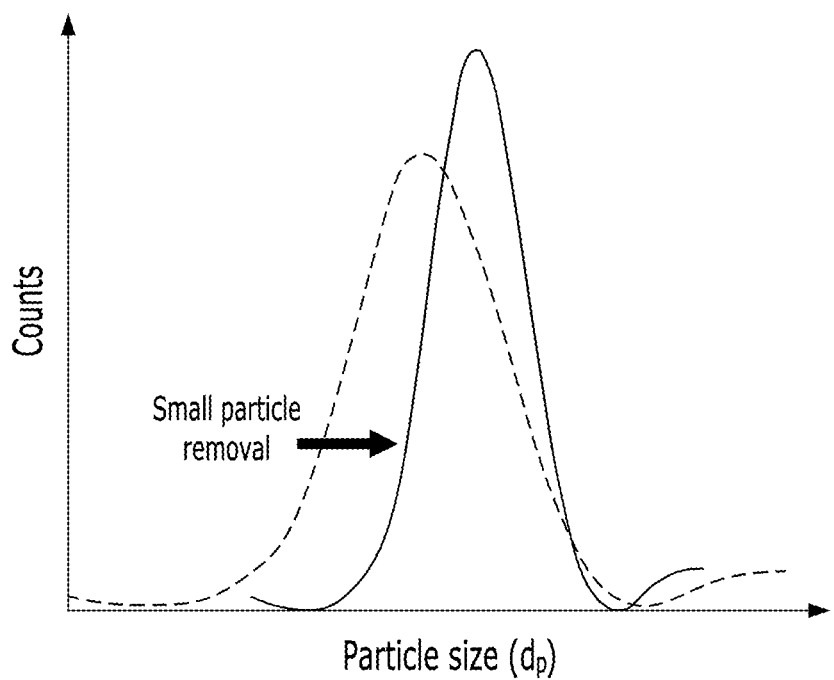
[Fig. 6]

[Fig. 7A]
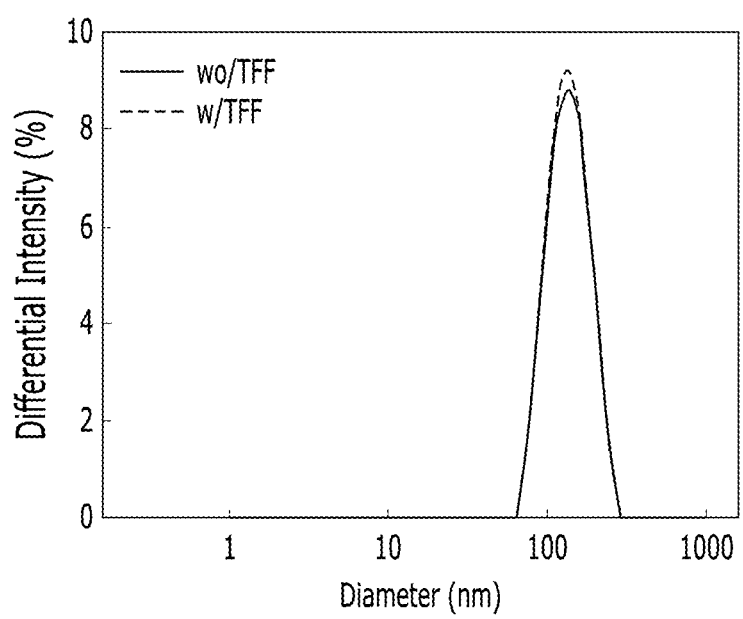

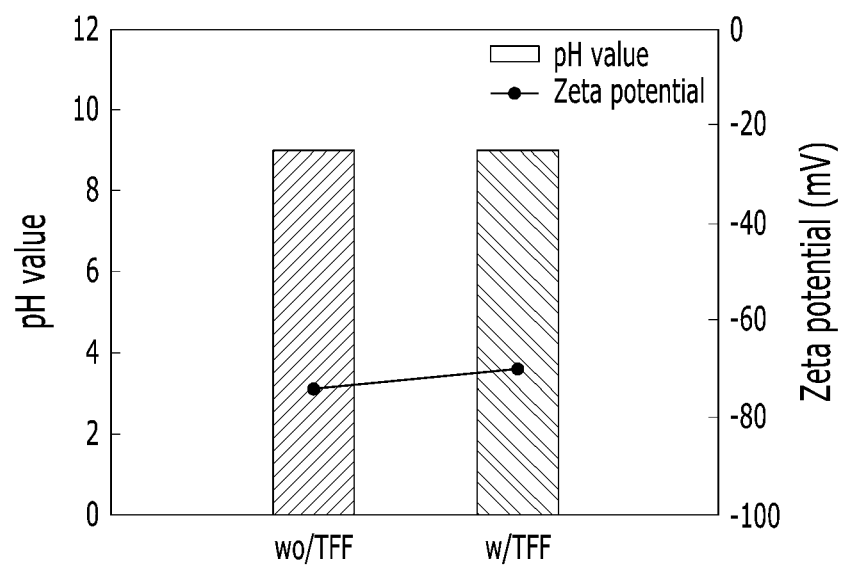
[Fig. 7B]

[Fig. 8]
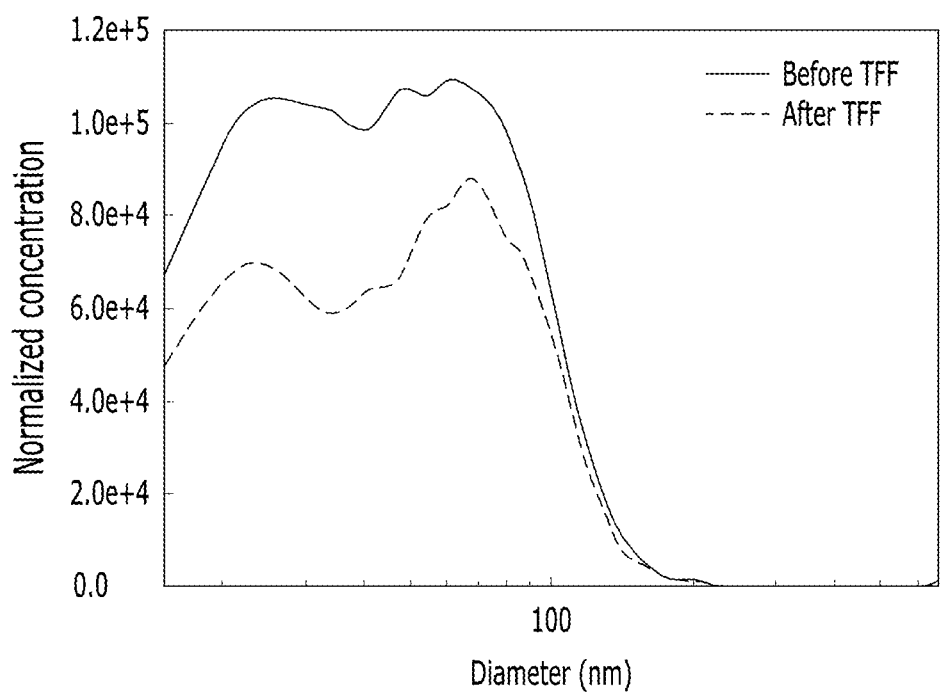

[Fig. 9A]
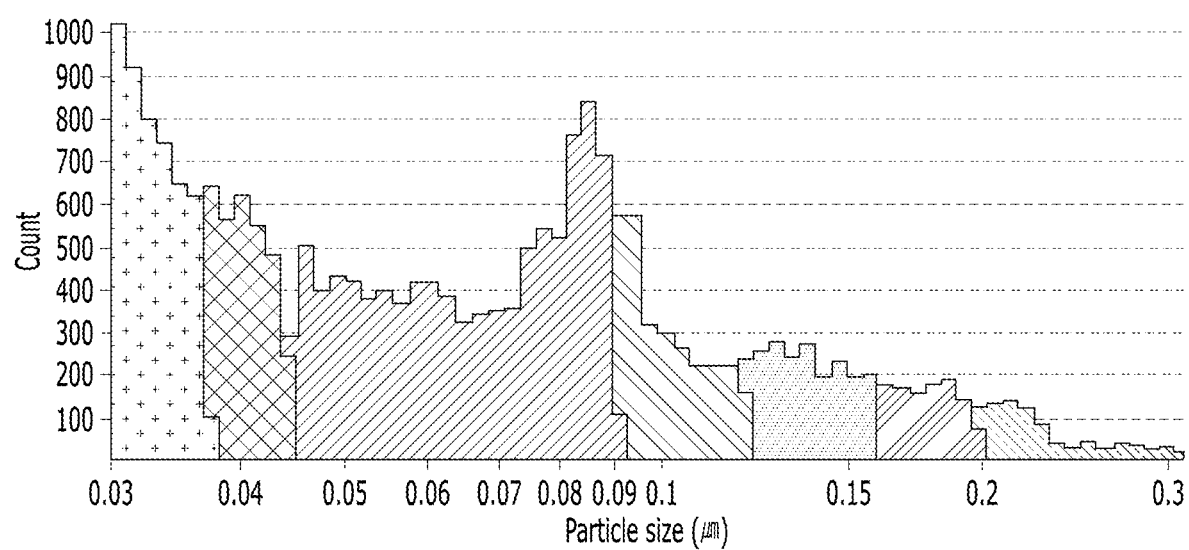

[Fig. 9B]
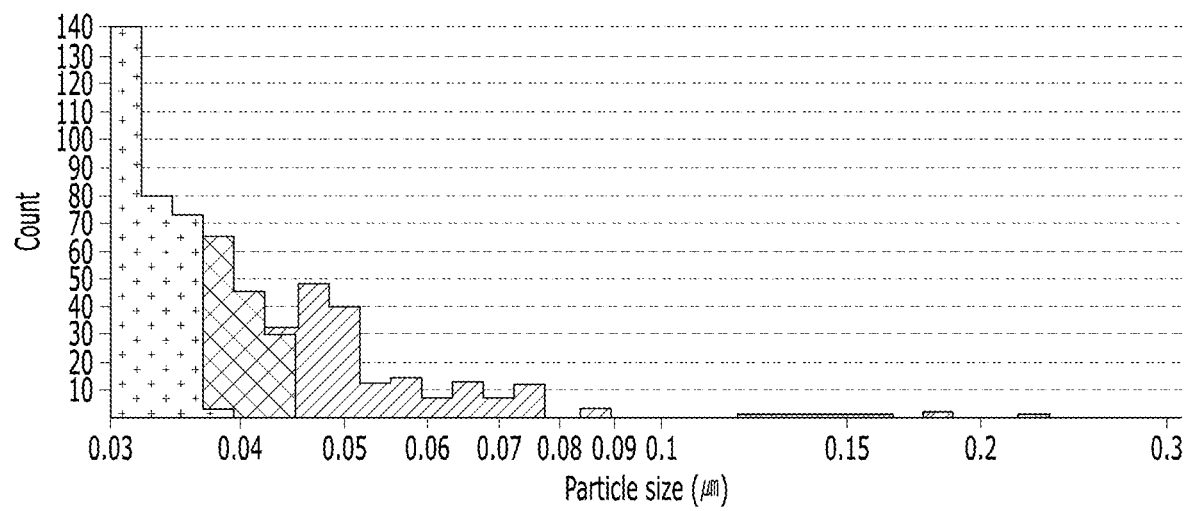

[Fig. 10A]
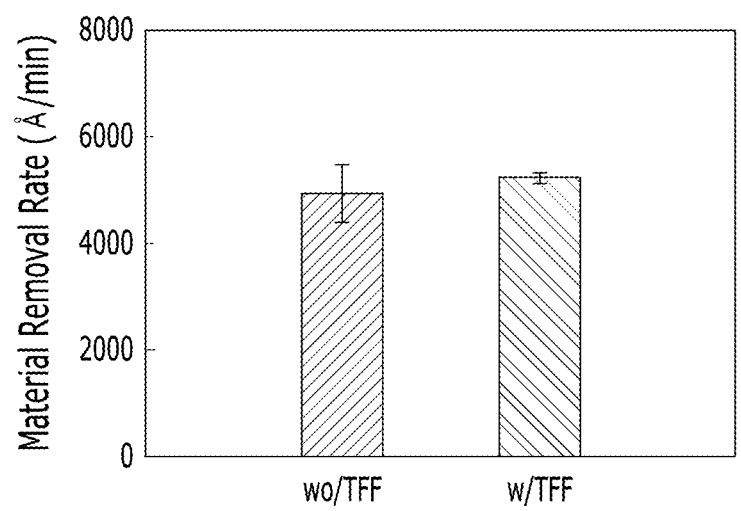

[Fig. 10B]
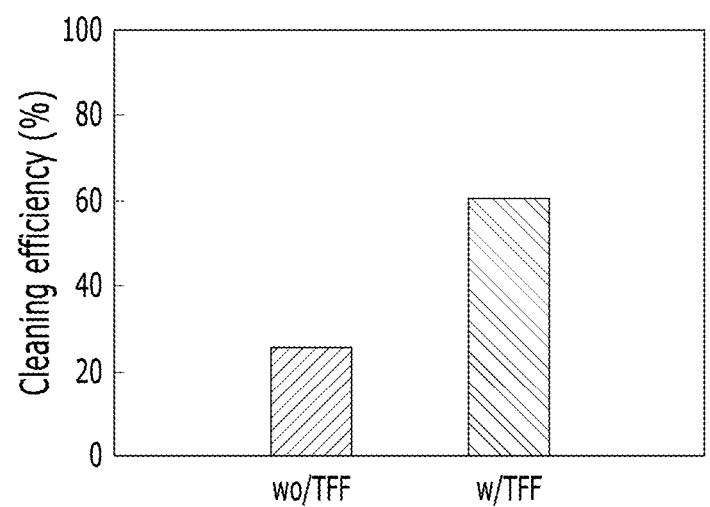

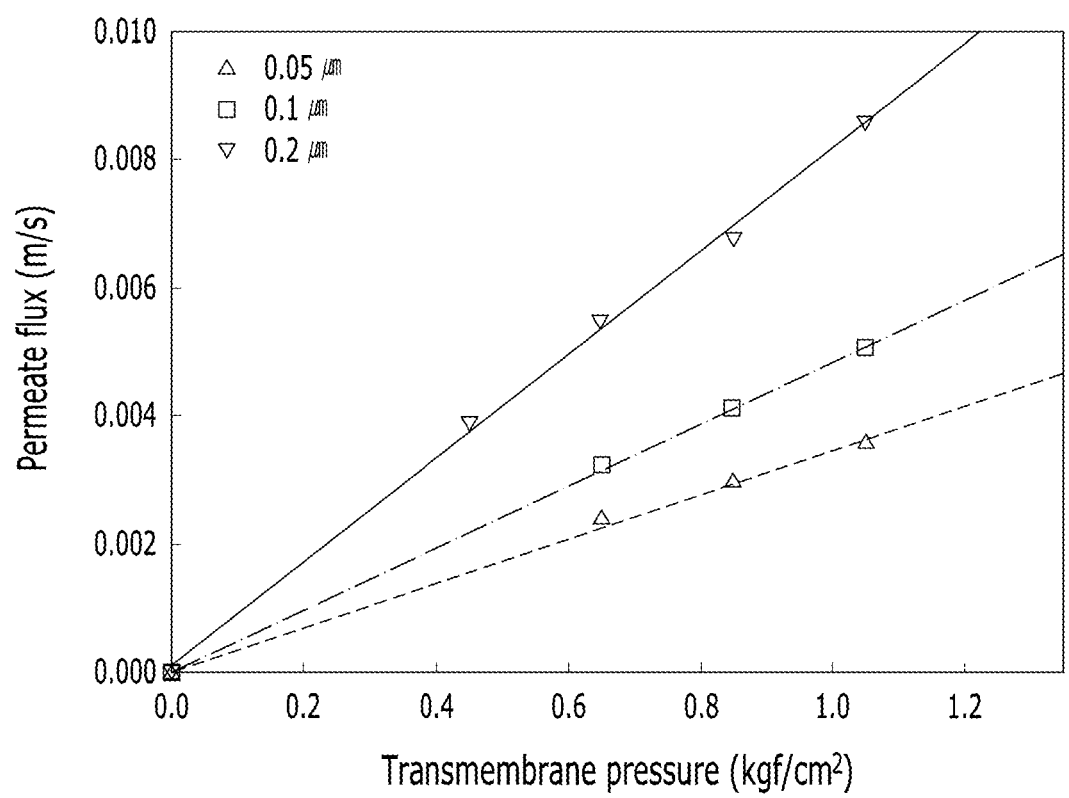
[Fig. 11]

[Fig. 12]
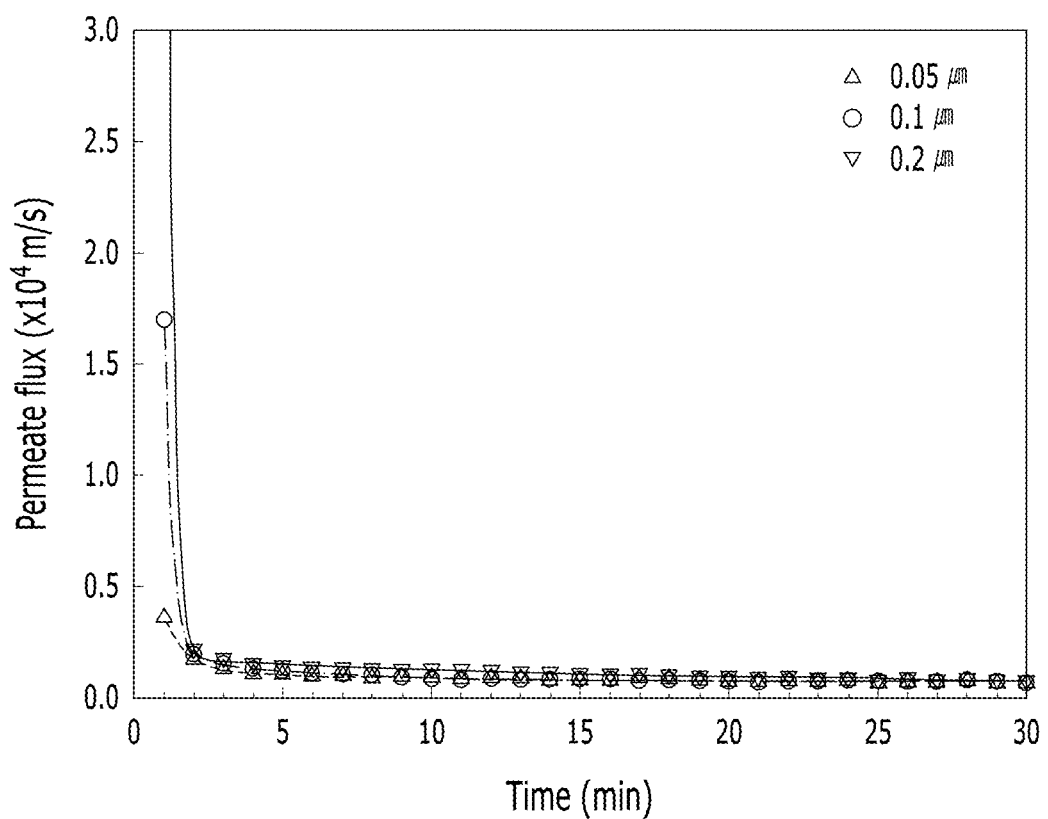

METHOD FOR PREPARING POLISHING SLURRY AND POLISHING METHOD USING SAME

CROSS-REFERENCE TO RELATED APPLICATIONS

This application claims the priority of Korean Patent Application No. 10-2021-0004610 filed on Jan. 13, 2021, and Korean Patent Application No. 10-2021-0148998 filed on Nov. 2, 2021, in the Korean Intellectual Property Office, the disclosure of which is incorporated herein by reference.

BACKGROUND

Field

The present application relates to a method for preparing a polishing slurry and a polishing method using the same.

Description of the Related Art

With the development of a new generation of semiconductors and the demand for more and more miniaturization and high capacity of products, semiconductor devices are becoming more and more highly integrated. In order to easily form a pattern on a wafer for a highly integrated semiconductor device, a CMP process of planarizing the surface of a wafer may be performed to maintain step height and roughness within a depth of focus (DOF) range. The CMP process polishes the wafer chemically and mechanically with the polishing pad and components of the slurry by continuously supplying a slurry containing an abrasive material and chemicals to a rotating polishing pad through a nozzle.

At this time, the polishing performance may vary greatly depending on material, roughness, porosity, grooves, etc. of the pad. Substances such as residues, foreign substances, lumped abrasive material, and pad debris generated while polishing the wafer may block pores composing the pad or may be embedded in the pores to become a factor causing scratches on the wafer.

Further, if the pores are clogged, the flow of the slurry may become unstable so that polishing performance may deteriorate. Therefore, in order to maintain the pad in a new and uniform state to prevent such a phenomenon, the conditioning process is performed simultaneously with or before and after the polishing process.

Korean Patent Laid-Open Publication No. 10-2011-0042622, which is the background technology of the present application, relates to a method for preparing a slurry for chemical mechanical polishing and a slurry for chemical mechanical polishing prepared using the same.

SUMMARY

The present application is to solve the aforementioned problems of the conventional art, and an object of the present application is to provide a method for preparing a polishing slurry having a small proportion of small-sized abrasive particles.

Further, another object of the present application is to provide a polishing slurry prepared by the above-mentioned preparation method and a polishing method using the polishing slurry.

However, the technical tasks to be achieved by the embodiment of the present application are not limited to the technical tasks described above, and other technical tasks may exist.

As a technical means for achieving the above-mentioned technical tasks, a first aspect of the present application provides a method for preparing a polishing slurry, the method including the steps of preparing a solution containing abrasive particles and a fluid, passing the solution through a porous membrane filter region, and preparing a polishing slurry by removing the fluid from the solution that has passed through the region, in which in the step of passing the solution through the region, those with a mean particle size of 100 nm or less among the abrasive particles are removed by a tangential flow filtration method.

According to an embodiment of the present application, in the process of passing the solution containing the abrasive particles and the fluid through the porous membrane filter region, the abrasive particles having a small mean particle size among the abrasive particles may pass through pores of the porous membrane filter, and large-sized abrasive particles may not pass through the pores, but the present application is not limited thereto.

According to an embodiment of the present application, the velocity $V_F(t)$ of the abrasive particles contained in the fluid that has passed through the porous membrane filter among the abrasive particles may be determined according to Equation 1 below, but the present application is not limited thereto.

$$V_F(t) = \frac{\Delta P}{\eta \times (R_M + R_L(t))} \quad \text{[Equation 1]}$$

In Equation 1, $\Delta P$ is a pressure difference (Pa) between the inside and outside of the porous membrane filter, $\eta$ is a viscosity (mPa·sec) of the solution, $R_M$ is a resistivity (m$^{-1}$) of the porous membrane filter, $R_L(t)$ is a resistance (m$^{-1}$) of the filter cake layer generated as the solution passes through the porous membrane filter, and t is a time.

According to an embodiment of the present application, the polishing slurry may contain those having a mean particle size of 100 nm or more among the abrasive particles, but the present application is not limited thereto.

According to an embodiment of the present application, in the step of passing the solution through the region, those having a mean particle size of 60 nm or less among the abrasive particles may be removed by the tangential flow filtration method, but the present application is not limited thereto.

According to an embodiment of the present application, the abrasive particles may have a mean particle size of 1 to 200 nm, but the present application is not limited thereto.

According to an embodiment of the present application, the abrasive particles removed by the tangential flow filtration method may have a mean particle size smaller than that of the polishing slurry, but the present application is not limited thereto.

According to an embodiment of the present application, the porous membrane filter may have pores of 30 to 200 nm, but the present application is not limited thereto.

According to an embodiment of the present application, the abrasive particles may include one selected from the group consisting of ceria ($CeO_2$), alumina ($Al_2O_3$), silicon carbide (SiC), diamond, zirconia ($ZrO_2$), and combinations thereof, but the present application is not limited thereto.

According to an embodiment of the present application, the fluid may include one selected from the group consisting of ethanol, deionized water, methanol, and combinations thereof, but the present application is not limited thereto.

According to an embodiment of the present application, the porous membrane filter may include one selected from the group consisting of polyethersulfone (PES), polyvinylidene fluoride (PVDF), polytetrafluoroethylene (PTFE), polysulfone, and combinations thereof, but the present application is not limited thereto.

A second aspect of the present application provides a polishing slurry prepared by the method according to the first aspect.

A third aspect of the present application provides a polishing method including the steps of polishing a polishing target material using the polishing slurry according to the second aspect, and washing the polished polishing target material.

According to an embodiment of the present application, the polishing target material may include one selected from the group consisting of $SiO_2$, Si, SiC, $Al_2O_3$, SiN, and combinations thereof, but the present application is not limited thereto.

The above-described problem solving means is merely exemplary, and should not be construed as an intention of limiting the present application. In addition to the exemplary embodiments described above, additional embodiments may exist in the drawings and detailed description of the invention.

According to the aforementioned problem solving means of the present application, the method for preparing the polishing slurry according to the present application may facilitate cleaning after polishing since the proportion of small-sized abrasive particles in the polishing slurry is small.

Specifically, when a polishing target material is polished using the polishing slurry, small-sized abrasive particles and large-sized abrasive particles may remain on the polishing target material. The adhesion force between the polishing target material and the abrasive particles is proportional to the size ($d_p$) of the abrasive particles, but the force for removing the adhered abrasive particles is proportional to the square ($d_p^2$) of the size of the abrasive particles so that there is a disadvantage in that the smaller the particles, the more difficult it is to remove them from the polished polishing target material. The present application can solve a problem that the abrasive particles remain on the polished material by removing a small-sized material in advance when preparing the polishing slurry.

Further, the polishing slurry according to the present application may have a polishing effect similar to that of a conventional polishing slurry containing small-sized particles.

The conventional polishing slurry has had a disadvantage in that the polishing rate is not even since small-sized and large-sized particles have been coexisted therein. However, since the small-sized particles have been removed from the polishing slurry according to the present application, the particle size distribution is narrow so that a uniform polishing rate can be obtained.

However, the effects obtainable from the present application are not limited to the aforementioned effects, and other effects may exist.

BRIEF DESCRIPTION OF THE DRAWINGS

FIG. 5 is a schematic diagram of a tangential flow filtration system according to an embodiment of the present application;

FIG. 6 is a graph related to a method for preparing a polishing slurry according to an embodiment of the present application;

FIGS. 7A and 7B are graphs of polishing slurries according to Exemplary Embodiment and Comparative Embodiment of the present application;

FIG. 8 is graphs of polishing slurries according to Exemplary Embodiment and Comparative Embodiment of the present application;

FIGS. 9A and 9B are graphs related to the number of particles remaining in the polishing target material after performing a polishing method using the polishing target material;

FIGS. 10A and 10B are graphs related to polishing methods according to Exemplary Embodiment and Comparative Embodiment of the present application;

FIG. 11 is a graph related to the resistivity of a membrane filter according to Exemplary Embodiment of the present application; and FIG. 12 is a graph related to the velocity of abrasive particles passing through the pores of the membrane filter of Exemplary Embodiment of the present application.

DETAILED DESCRIPTION OF THE EMBODIMENT

Figure 1:
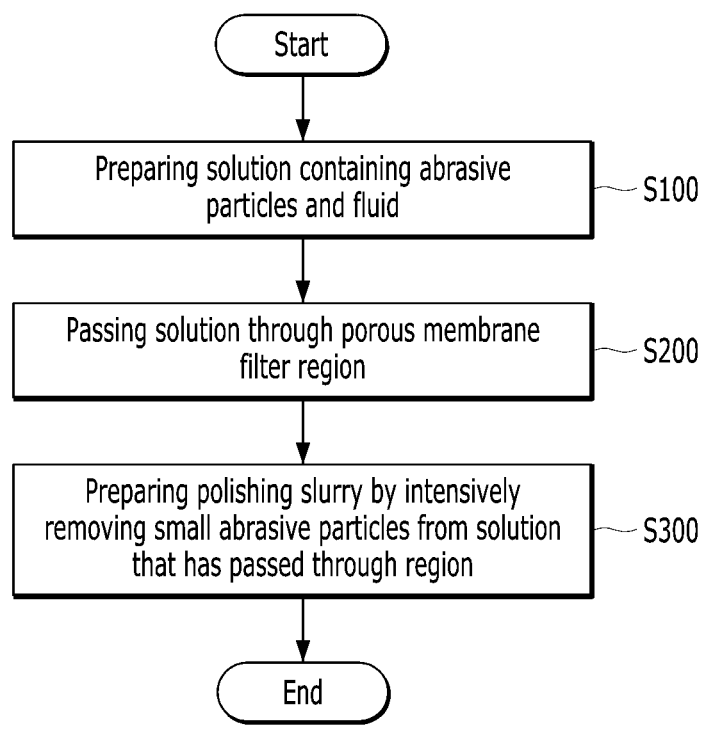
FIG. 1 is a flowchart illustrating a method for preparing a polishing slurry according to an embodiment of the present application.

Hereinafter, embodiments of the present application will be described in detail with reference to the accompanying drawings so that those with ordinary skill in the art to which the present application pertains will easily be able to implement the present application.

However, the present application may be implemented in various different forms and is not limited to the embodiments described herein. Further, parts irrelevant to the description are omitted in order to clearly describe the present application in the drawings, and similar reference numerals are attached to similar parts throughout the specification.

In the whole specification of the present application, when a part is said to be "connected" with the other part, it not only includes a case that the part is "directly connected" to the other part, but also includes a case that the part is "electrically connected" to the other part with another element being interposed therebetween.

In the whole specification of the present application, when any member is positioned "on", "over", "above", "beneath", "under", and "below" the other member, this not only includes a case that the any member is brought into contact with the other member, but also includes a case that another member exists between two members.

In the whole specification of the present application, if a prescribed part "includes" a prescribed element, this means that another element can be further included instead of excluding other elements unless any particularly opposite description exists.

When unique manufacture and material allowable errors of numerical values are suggested to mentioned meanings of terms of degrees used in the present specification such as "about", "substantially", etc., the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, in the whole specification of the present application, "a step to do ~" or "a step of ~" does not mean "a step for ~".

In the whole specification of the present application, a term of "a combination thereof" included in a Markush type expression, which means a mixture or combination of one or more selected from the group consisting of elements described in the Markush type expression, means including one or more selected from the group consisting of the elements.

In the whole specification of the present application, description of "A and/or B" means "A, B, or A and B".

Hereinafter, a polishing slurry of the present application and a polishing method using the same will be described in detail with reference to embodiments, examples, and drawings. However, the present application is not limited to such embodiments, examples, and drawings.

As a technical means for achieving the above-mentioned technical tasks, the first aspect of the present application provides a method for preparing a polishing slurry, the method including the steps of preparing a solution containing abrasive particles and a fluid, passing the solution through a porous membrane filter region, and preparing a polishing slurry by removing the fluid from the solution that has passed through the region, in which in the step of passing the solution through the region, those with a mean particle size of 100 nm or less among the abrasive particles are removed by a tangential flow filtration method.

According to an embodiment of the present application, in the process of passing the solution containing the abrasive particles and the fluid through the porous membrane filter region, the abrasive particles having a small mean particle size among the abrasive particles may pass through pores of the porous membrane filter, and large-sized abrasive particles may not pass through the pores, but the present application is not limited thereto.

FIG. 1 is a flowchart illustrating a method for preparing a polishing slurry according to an embodiment of the present application.

The polishing slurry prepared by a conventional method for preparing a polishing slurry contains small-sized abrasive particles as well as large-sized abrasive particles. Polishing slurries having various particle sizes do not have a constant polishing rate, and small abrasive particles that are difficult to remove by only a conventional cleaning process may exist on a surface plate or wafer after polishing.

In order to solve such a problem, the present application provides a method for selectively removing small-sized abrasive particles when preparing a polishing slurry.

Figure 2:
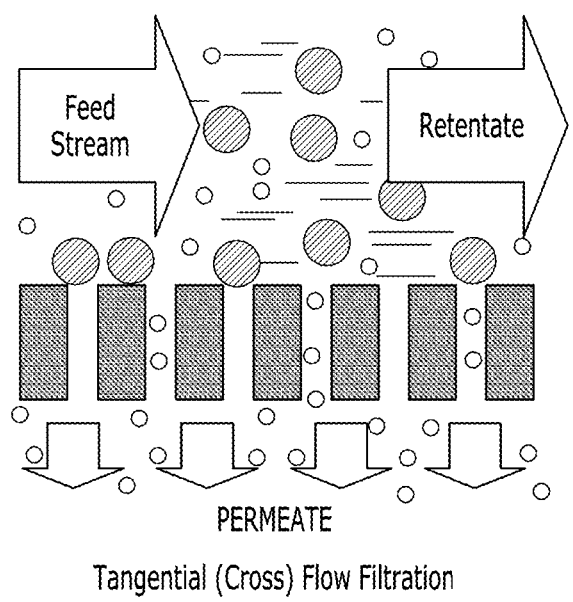
FIG. 2 is a schematic diagram showing a tangential flow filtration method according to an embodiment of the present application.
Figure 3:
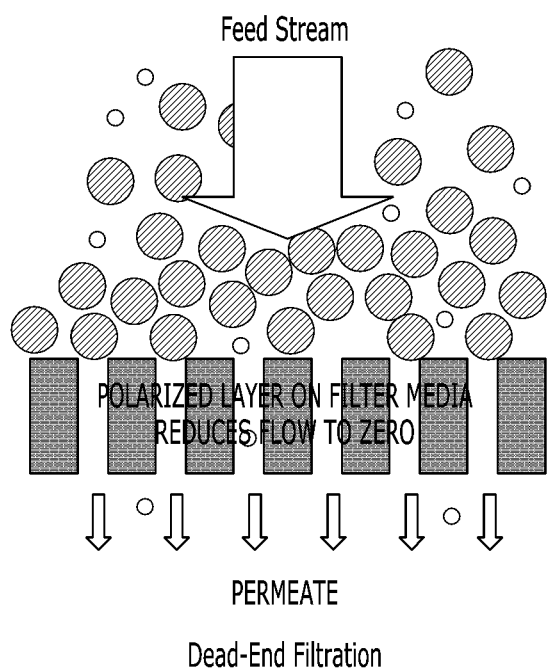
FIG. 3 is a schematic diagram showing a conventional dead-end filtration (or dead-end flow filtration) method.

FIG. 2 is a schematic diagram showing a tangential flow filtration method according to an embodiment of the present application, and FIG. 3 is a schematic diagram showing a conventional dead-end filtration (or dead-end flow filtration) method.

The tangential flow filtration method according to the present application and the conventional dead-end filtration (or dead-end flow filtration) method have a difference in the direction in which the solution containing the particles flows and the direction in which the particles are filtered. Referring to FIGS. 2 and 3, in the tangential flow filtration method, the small-sized particles may pass through the filter while a flow in which large-sized particles and small-sized particles are mixed proceeds in a direction horizontal to a filter. At this time, even if the large-sized particles of the particles block pores of the filter, the flow in which the two types of particles are mixed moves in a horizontal direction with respect to the filter so that even if the large-sized particles blocking the pores of the filter block the pores, the particles that have blocked the pores may be moved by the flow, thereby enabling a cake layer to be prevented from being formed on the filter.

Further, regardless of whether the large-sized particles block the pores, the small-sized particles may pass through the pores of the porous membrane filter by the flow.

However, in the dead-end filtration (or dead-end flow filtration) method, as the flow in which the large-sized particles and the small-sized particles are mixed proceeds in a direction perpendicular to the filter, the large-sized particles block the pores of the filter so that there may be the case that the small-sized particles do not pass through the filter.

Since the method for preparing the polishing slurry according to the present application uses the tangential flow filtration method, it is possible to effectively remove the small-sized particles unlike the method for preparing a polishing slurry using the conventional dead-end filtration (or dead-end flow filtration) method.

In this regard, as "removing small-sized particles" according to the present application may mean "removing abrasive particles having a mean particle size of 100 nm or less" or "removing abrasive particles having a mean particle size of 60 nm or less", the description that some particles have been removed from the polishing slurry may mean that the abrasive particles are filtered so that the number of particles of a certain size or less in the abrasive particles is 70% or less, and mean that the small-sized particles are separated from the abrasive particles to increase the ratio of the large-sized particles in the polishing slurry. At this time, the filtered solution is a solution that passes through the porous membrane filter region to mainly contain particles of a certain size or more, and the solution that has passed through the pores of the porous membrane filter contains the small-sized abrasive particles. Further, the polishing slurry may be obtained by passing a solution in which particles of a predetermined size or more and particles of a predetermined size or less are mixed through the porous membrane filter region to remove the particles of a predetermined size or less.

First, a solution containing abrasive particles and a fluid is prepared (S100).

According to an embodiment of the present application, the abrasive particles may include one selected from the group consisting of ceria ($CeO_2$), alumina ($Al_2O_3$), silicon carbide (SiC), diamond, zirconia ($ZrO_2$), and combinations thereof, but the present application is not limited thereto.

According to an embodiment of the present application, the fluid may include one selected from the group consisting of ethanol, deionized water, methanol, and combinations thereof, but the present application is not limited thereto.

The viscosity of the solution may be related to a velocity ($V_F(t)$) at which the small-sized abrasive particles among the abrasive particles pass through the pores of the porous membrane filter by the tangential flow filtration method.

According to an embodiment of the present application, the abrasive particles may have a mean particle size of 1 to 200 nm, but the present application is not limited thereto.

For example, the abrasive particles may have a mean particle size of about 1 to 200 nm, about 5 to 200 nm, about 10 to 200 nm, about 15 to 200 nm, about 20 to 200 nm, about 25 to 200 nm, about 30 to 200 nm, about 35 to 200 nm, about 40 to 200 nm, about 45 to 200 nm, about 50 to 200 nm, about 55 to 200 nm, about 60 to 200 nm, about 70 to 200 nm, about 80 to 200 nm, about 90 to 200 nm, about 100 to 200 nm, about 125 to 200 nm, about 150 to 200 nm, about 175 to 200 nm, about 1 to 5 nm, about 1 to 10 nm, about 1 to 15 nm, about 1 to 20 nm, about 1 to 25 nm, about 1 to 30 nm, about 1 to 35 nm, about 1 to 40 nm, about 1 to 45 nm, about 1 to 50 nm, about 1 to 55 nm, about 1 to 60 nm, about 1 to 70 nm, about 1 to 80 nm, about 1 to 90 nm, about 1 to 100 nm, about 1 to 125 nm, about 1 to 150 nm, about 1 to 175 nm, about 5 to 175 nm, about 10 to 150 nm, about 15 to 125 nm, about 20 about 100 nm, about 25 to 90 nm, about 30 to 80 nm, about 35 to 70 nm, about 40 to 60 nm, or about 45 to 50 nm, but the present application is not limited thereto.

In this regard, the abrasive particles include particles having a size of 1 to 200 nm. As will be described later, the small-sized particles of the abrasive particles, for example, abrasive particles having a size of 100 nm or less, may pass through the pores of the porous membrane filter, and abrasive particles having a size of 100 nm or more may pass through a space formed in the surface of the porous membrane filter instead of not passing through the pores of the porous membrane filter.

Subsequently, the solution passes through the porous membrane filter region (S200).

In this regard, the porous membrane filter region means the space formed on the surface of the porous membrane filter, and the solution may proceed in a direction perpendicular to the filtering direction of the porous membrane filter. At this time, referring to FIG. 2, when the solution passes through the porous membrane filter region, the large-sized particles and the small-sized particles in the solution may pass through the porous membrane filter region. Even if the large-sized particles in the solution block the pores of the porous membrane filter, they may be moved by the flow of the solution so that the small-sized particles in the solution may pass through the porous membrane filter together with the fluid in the solution.

According to an embodiment of the present application, in the step of passing the solution through the porous membrane filter region, those having a mean particle size of 100 nm or less among the abrasive particles may be removed by the tangential flow filtration method, but the present application is not limited thereto.

For example, the abrasive particles having a mean particle size of about 100 nm or less, about 90 nm or less, about 80 nm or less, about 70 nm or less, about 60 nm or less, about 50 nm or less, about 40 nm or less, about 30 nm or less, preferably 60 nm or less among the abrasive particles may be removed by the tangential flow filtration method.

According to an embodiment of the present application, in the step of passing the solution through the porous membrane filter region, a portion of the abrasive particles in the solution may pass through the porous membrane filter, but the present application is not limited thereto. As described above, the abrasive particles passing through the porous membrane filter may be abrasive particles having a small size (e.g., a mean particle size of 100 nm or less) among the abrasive particles in the solution.

According to an embodiment of the present application, the velocity $V_F(t)$ of the abrasive particles contained in the fluid that has passed through the porous membrane filter among the abrasive particles may be determined according to Equation 1 below, but the present application is not limited thereto.

$$V_F(t) = \frac{\Delta P}{\eta \times (R_M + R_L(t))} \quad \text{[Equation 1]}$$

In Equation 1, $\Delta P$ is a pressure difference (Pa) between the inside and outside of the porous membrane filter, $\eta$ is a viscosity (mPa·sec) of the solution, $R_M$ is a resistivity (m$^{-1}$) of the porous membrane filter, $R_L(t)$ is a resistance (m$^{-1}$) of the filter cake layer generated as the solution passes through the porous membrane filter, and t is a time.

If Equation 1 above is specifically described, $\Delta P$ is a transmembrane pressure, and it means an actual pressure difference between the inside and the outside applied to the surface of the porous membrane filter in a filter cell unit including a porous membrane filter, $V_F(t)$ is a velocity (m/s) of small-sized particles passing along with the fluid passing through the porous membrane filter, $R_M$ is a resistivity (m$^{-1}$) of the porous membrane filter, and $R_L(t)$ means a resistance (m$^{-1}$) of the filter cake layer that occurs when the solution passes through the porous membrane filter region.

Figure 4:
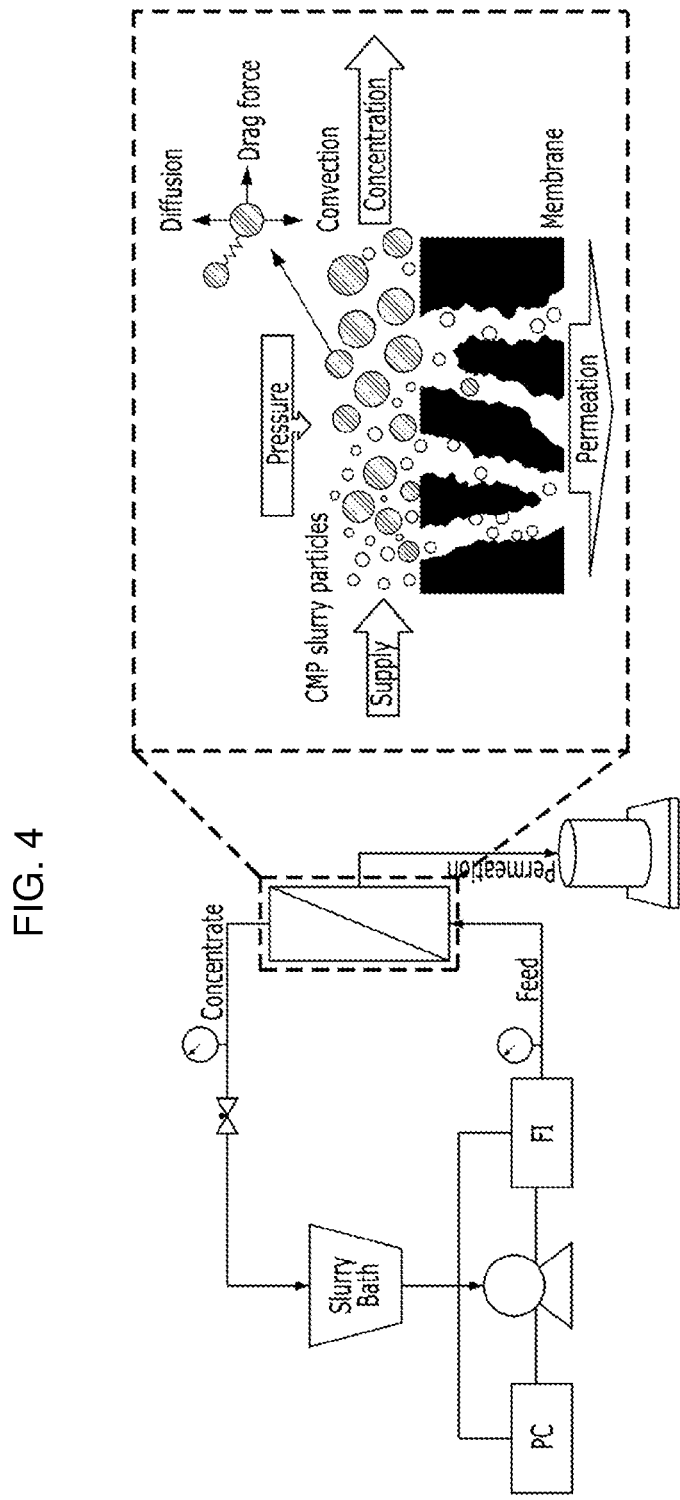
FIG. 4 is a tangential flow filtration system according to an embodiment of the present application.

FIG. 4 is a tangential flow filtration system according to an embodiment of the present application, and FIG. 5 is a schematic diagram of a tangential flow filtration system according to an embodiment of the present application.

Referring to FIG. 4, the solution containing the abrasive particles receives a pressure in a direction perpendicular to the proceeding direction of the solution so that the small-sized abrasive particles in the solution may pass (permeate) through the porous membrane filter. As the small-sized abrasive particles are removed from the solution, the solution may be concentrated into the large-sized abrasive particles.

Hereinafter, methods of measuring $\Delta P$, $V_F(t)$, $\eta$, $R_M$, and $R_L(t)$ will be described in order with reference to FIGS. 2, 4, and 5.

Referring to FIGS. 4 and 5, $\Delta P$ means a pressure difference between the inside and outside of the surface of the membrane in the spatial region above the porous membrane filter surface (i.e., the porous membrane filter region), and may be defined as Equation 2 below.

$$\Delta P = \frac{P_{feed} + P_{retentate}}{2} - P_{permeate} \quad \text{[Equation 2]}$$

In Equation 2, $P_{permeate}$ may be omitted since it means atmospheric pressure, $P_{feed}$ means a pressure of the solution measured in the pipe before passing through the porous membrane filter region, and $P_{retentate}$ means a pressure of the solution measured in the pipe after passing through the porous membrane filter region. Referring to FIG. 5, $P_{feed}$ is a pressure of the solution supplied to the filter cell unit, and $P_{retentate}$ is a pressure of the solution discharged from the filter cell unit.

That is, $P_{feed}$ means a pressure generated by the solution containing both large-sized particles and small-sized particles, and $P_{retentate}$ means a pressure generated by the solution containing only the large-sized particles.

Meanwhile, $V_F(t)$ means a velocity of the fluid and small-sized particles discharged to the lower part of the porous membrane filter through the pores of the porous membrane filter when the solution passes through the porous membrane filter region, and it may be obtained by disposing a standard analytical microbalance under the filter, and may be defined by Equation 3 below.

$$V_F(t) = \frac{\text{weight of permeate portion}}{\text{membrane area} \times \text{time}} \qquad \text{[Equation 3]}$$

At this time, the unit of the right side in Equation 3 above is g/(m²·sec), but it may be multiplied by the reciprocal of the density of the fluid and small-sized particles. That is, the unit of $V_F(t)$ may be m/s or g/(m²·sec).

Further, as the size of the pores of the porous membrane filter increases, $V_F(t)$ may increase, but may converge to a constant value over time. That is, the size of the pores of the porous membrane filter may determine the initial velocity of the fluid and small-sized particles discharged to the lower part of the porous membrane filter.

η is one obtained by measuring the viscosity of the abrasive particles through a viscometer, and may have a dimension of Pa·sec.

Meanwhile, the numerical value of $R_M$ may be obtained using deionized water. Specifically, referring to FIG. 2, the small-sized particles and large-sized particles among the abrasive particles should be separated by the pores of the porous membrane filter. However, when the particles agglomerate inside and around the pores, the small-sized particles do not pass through the pores, which is called a resistivity ($R_M$) of the porous membrane filter. That is, when deionized water that does not contain abrasive particles is passed through the porous membrane filter region, a portion of the deionized water may pass through the porous membrane filter, and the remaining portion thereof may pass through the region.

At this time, since the velocity ($V_F(t)$) of the fluid passing through the porous membrane filter varies depending on the transmembrane pressure (ΔP), and it depends on the size of the pores of the porous membrane filter, $R_M$ may be calculated through a slope between ΔP and $V_F(t)$ at this time and may have a relational expression of Equation 4 below.

$$R_M = \frac{\Delta P}{\eta \cdot V_F(t)} \qquad \text{[Equation 4]}$$

Equation 4 is a modification of Equation 1 above, and as mentioned above, since deionized water does not contain abrasive particles and thus a cake layer is not generated by the particles, $R_L(t)$ in Equation 1 may be treated as 0. Further, η in Equation 4 above means the viscosity of deionized water.

That is, $R_M$ is a resistivity of the filter determined depending on the size and material of the pores of the porous membrane filter.

$R_L(t)$ refers to a resistance of the filter cake layer occurred as the abrasive particles agglomerate inside, outside, and around the pores of the porous membrane filter by the flow of a solution containing the abrasive particles. Since the thickness of the filter cake layer may change with time, the degree to which the particles pass through the layer may also change with time, but the thickness or the degree of passing the particles through the layer with the passage of time may converge to a certain numerical value.

At this time, $R_L(t)$ may be obtained by measuring the weight after drying the solution or measuring the cross-section of the membrane through a microscope, or may be indirectly measured through a change in the thickness of the cake layer in real time. For example, $R_L$ may be calculated as a multiplication of the mass (W) and the specific resistance (α) of the cake layer produced per unit area of the porous membrane filter (Equation 5-1 below), calculated as a proportional expression of the cake layer (Equation 5-2 below), or obtained by substituting ΔP, $V_F(t)$, η, and $R_M$ in Equation 1 above.

$$R_L = \alpha W \qquad \text{[Equation 5-1]}$$

$$R_L \propto \text{Cake layer thickness} \qquad \text{[Equation 5-2]}$$

At this time, Equation 5-2 means that as the thickness of the cake layer increases, the size of $R_L$ increases.

However, since, when the concentration of the abrasive particles in the solution is low, the cake layer is not well formed so that measurement may be difficult, it may be obtained by substituting ΔP, $V_F(t)$, η, and $R_M$ in Equation 1 above. At this time, $R_M$ is a unique value of the porous membrane filter, and ΔP and $V_F(t)$ are values that may be obtained through measurement so that $R_L(t)$ may be inversely calculated through Equation 1 above.

In this regard, since the thickness of the filter cake layer changes with time, the velocity of the fluid and the abrasive particles passing through the porous membrane filter among the abrasive particles may be expressed as a function of time.

FIG. 6 is a graph related to a method for preparing a polishing slurry according to an embodiment of the present application.

Referring to FIG. 6, since a portion of the abrasive particles in the solution is removed by passing through the porous membrane filter, and only the remaining non-passed abrasive particles may be taken to prepare a polishing slurry, the polishing slurry may have a large mean particle size compared to the abrasive particles in the solution that have not passed through the solution region.

According to an embodiment of the present application, the pressure may be 0.1 to 50 bars, but the present application is not limited thereto. For example, the pressure may be about 0.1 to 50 bars, about 1 to 50 bars, about 2 to 50 bars, about 3 to 50 bars, about 4 to 50 bars, about 5 to 50 bars, about 7.5 to 50 bars, about 10 to 50 bars, about 15 to 50 bars, about 20 to 50 bars, about 25 to 50 bars, about 30 to 50 bars, about 35 to 50 bars, about 40 to 50 bars, about 45 to 50 bars, about 0.1 to 1 bar, about 0.1 to 2 bars, about 0.1 to 3 bars, about 0.1 to 4 bars, about 0.1 to 5 bars, about 0.1 to 7.5 bars, about 0.1 to 10 bars, about 0.1 to 15 bars, about 0.1 to 20 bars, about 0.1 to 25 bars, about 0.1 to 30 bars, about 0.1 to 35 bars, about 0.1 to 40 bars, about 0.1 to 45 bars, about 1 to 45 bars, about 2 to 40 bars, about 3 to 35 bars, about 4 to 30 bars, about 5 to 25 bars, about 7.5 to 20 bars, or about 10 to 15 bars, and preferably about 1 to 5 bars, but the present application is not limited thereto.

The pressure refers to a pressure difference between the inside and outside of the porous membrane filter, and may be generated by the solution.

According to an embodiment of the present application, the pores of the porous membrane filter may be 30 to 200 nm, but the present application is not limited thereto. For example, the pores of the porous membrane filter may be about 30 to 200 nm, about 40 to 200 nm, about 50 to 200 nm, about 60 to 200 nm, about 70 to 200 nm, about 80 to 200 nm, about 90 to 200 nm, about 100 to 200 nm, about 125 to 200 nm, about 150 to 200 nm, about 175 to 200 nm, about 30 to 40 nm, about 30 to 50 nm, about 30 to 60 nm, about 30 to 70 nm, about 30 to 80 nm, about 30 to 90 nm, about 30 to 100 nm, about 30 to 125 nm, about 30 to 150 nm, about 30 to 175 nm, about 40 to 175 nm, about 50 to 150 nm, about 60 to 125 nm, about 70 to 100 nm, or about 80 to 90 nm, but the present application is not limited thereto.

The pores are for passing the small-sized abrasive particles in the solution, and as will be described later, may be related to the resistivity ($R_M$) or the like of the porous membrane filter.

According to an embodiment of the present application, the polishing slurry may contain those having a mean particle size of 100 nm or more among the abrasive particles, but the present application is not limited thereto.

According to an embodiment of the present application, the mean particle size of the abrasive particles removed by the tangential flow filtration method may be smaller than the mean particle size of the polishing slurry, but the present application is not limited thereto. At this time, the abrasive particles removed by the tangential flow filtration method may refer to abrasive particles having a small size (e.g., 100 nm or less) among the abrasive particles in a solution containing the abrasive particles and the fluid, and the polishing slurry may refer to abrasive particles having a large size (e.g., 100 nm or more) among the abrasive particles in the solution containing the abrasive particles and the fluid.

As will be described later, the polishing slurry may be one in which small particles in the abrasive particles are removed, but the mean particle size of the abrasive particles before performing the tangential flow filtration method may be similar to that of the abrasive particles (polishing slurry) after performing the tangential flow filtration method. At this time, the mean particle size of the polishing slurry is measured by a dynamic light scattering (DLS) method. Due to the limitation of the measurement method, even if the number of the small-sized particles decreases, the mean particle size may not change.

According to an embodiment of the present application, the mean particle size of the abrasive particles removed by the tangential flow filtration method may be 100 nm or less, and the mean particle size of the polishing slurry may be 100 nm or more, but the present application is not limited thereto.

According to an embodiment of the present application, a direction in which the abrasive particles in the solution pass through the porous membrane filter and a direction in which the solution proceeds may be perpendicular, but the present application is not limited thereto.

The description that "the direction in which the abrasive particles in the solution pass through the porous membrane filter and the direction in which the solution proceeds are perpendicular" according to the present application means that an angle between the direction in which the abrasive particles pass through the filter and the direction in which the solution passes through the region (i.e., the direction in which the solution proceeds) is 70° to 110°.

According to an embodiment of the present application, the porous membrane filter may include one selected from the group consisting of polyethersulfone (PES), polyvinylidene fluoride (PVDF), polytetrafluoroethylene (PTFE), polysulfone, and combinations thereof, but the present application is not limited thereto. Preferably, the porous membrane filter may be made of a hydrophilic material, but the present application is not limited thereto.

Subsequently, the fluid is removed from the solution that has passed through the region (S300).

At this time, the solution passing through the porous membrane filter region may be divided into a solution passing through the inside of the pores of the porous membrane filter and a solution which passes through the surface of the porous membrane filter and does not pass through the inside of the pores, the solution passing through the inside of the pores of the porous membrane filter may contain small-sized abrasive particles, and the solution passing through the surface of the porous membrane filter may mainly contain large-sized abrasive particles. That is, the solution passing through the region refers to a solution passing through the space formed in the porous membrane filter, that is, a solution which passes through the surface of the porous membrane filter and does not pass through the inside of the pores of the porous membrane filter, and means the concentrate portion of FIG. 4.

According to an embodiment of the present application, the step of removing the fluid from the solution may include a process selected from the group consisting of evaporation, filtration, separation, heating, and combinations thereof, and may be performed generally using the process used in order to separate liquid and particles.

The second aspect of the present application provides the polishing slurry prepared by the method according to the first aspect.

As described above, when a solution containing the abrasive particles and the fluid is passed through the porous membrane filter region, the small-sized abrasive particles among the abrasive particles may pass through the pores of the porous membrane filter, and the large-sized abrasive particles among the abrasive particles may not pass through the pores of the porous membrane filter so that the small-sized abrasive particles may pass through the porous membrane filter region along with the fluid. At this time, when a portion of the fluid and the small-sized abrasive particles that have passed through the porous membrane filter region are removed from the solution that has passed through the porous membrane filter region, only the fluid and abrasive particles of a certain size or more may remain in the solution that has passed through the porous membrane filter region. That is, the polishing slurry is obtained by removing the fluid from a solution from which abrasive particles of a certain size or less in the solution are removed.

At this time, the polishing slurry prepared from the solution that has passed through the porous membrane filter region may contain a small amount of fluid.

The third aspect of the present application provides a polishing method including the steps of polishing a polishing target material using the polishing slurry according to the second aspect, and washing the polished polishing target material.

With respect to the second and third aspects of the present application, detailed descriptions of parts overlapping with the first aspect of the present application have been omitted, but even if the descriptions have been omitted, the contents described in the first aspect of the present application may be equally applied to the second and third aspects of the present application.

According to an embodiment of the present application, the polishing target material may include one selected from the group consisting of $SiO_2$, Si, SiC, $Al_2O_3$, SiN, and combinations thereof, but the present application is not limited thereto.

After the polishing target material is polished with a polishing slurry, particles of the polishing slurry may remain on the surface of the polishing target material. Therefore, in order to use the polished polishing target material later, it is necessary to remove particles of the polishing slurry remaining on the surface of the polishing target material.

According to an embodiment of the present application, the adhesion force between the polishing slurry particles and the surface of the polished polishing target material may be determined according to Equation 6 below, and the removal force may be determined according to Equation 7 below, but the present application is not limited thereto.

$$F_{Ad} = \frac{A_{132}d_p}{12Z_0^2} \quad [\text{Equation 6}]$$

$$F_D = \frac{3\pi\mu d_p^2}{2h}U \quad [\text{Equation 7}]$$

In Equations 6 and 7, $A_{132}$ is a Hamaker constant between the particles and the polishing target material, $d_p$ is a diameter of the abrasive particles contained in the polishing slurry, $Z_0$ is a distance between the abrasive particles and the surface of the polishing target material, $\mu$ is a viscosity of the fluid, U is a relative velocity between the pad and the polishing target material, and h is a gap between the pad and the polishing target material.

Specifically, $F_{Ad}$ refers to an adhesive force between the surface of the polishing target material and the abrasive particles (polishing slurry particles), and $A_{132}$ is a Hamaker constant, and may be expressed as a relational expression of a Hamaker constant ($A_{11}$) of the polishing target material, a Hamaker constant ($A_{22}$) of the abrasive particles, and a Hamaker constant ($A_{33}$) of the fluid of the polishing slurry.

Further, $F_D$ refers to a force required to remove the polishing slurry from the surface of the polishing target material, and U is a relative velocity of the fluid between the polishing pad and the polishing target material.

$F_{Ad}$ and $F_D$ in Equations 6 and 7 above are values obtained through theoretical calculations, and some difficult-to-measure values may be assumed to be arbitrary numerical values. For example, $Z_0$ may be each 0.4 to 3 nm, and h may be 30 μm.

Referring to Equations 6 and 7 above, the adhesive force is proportional to the particle size ($d_p$), and the removal force is proportional to the particle size square ($d_p^2$). At this time, as the size of the particles is smaller, the adhesive force is greater than the removal force so that it is difficult to remove small particles to a certain size or less.

However, since the small-sized particles have been removed in the process of preparing the polishing slurry according to the present application, it is easy to remove the small-sized particles remaining on the polishing target material after polishing compared to the conventional polishing slurry.

According to an embodiment of the present application, the cleaning efficiency of the polishing method may be 50 to 80%, but the present application is not limited thereto.

The cleaning efficiency according to the present application is a ratio between the polishing slurry particles that are present on the polished polishing target material before cleaning and the polishing slurry particles that are present on the polished polishing target material after cleaning, and may be defined by various factors such as the number, mass, volume, and the like of the abrasive particles.

Since the conventional polishing slurry contains a large number of small-sized abrasive particles (e.g., abrasive particles having a particle size of 100 nm or less), even if they are cleaned after polishing, the small-sized particles are not easily removed so that the cleaning efficiency may be as low as about 20 to 40%. However, since the small-sized abrasive particles have been removed or separated in the process of preparing the polishing slurry according to the present application, the small-sized abrasive particles may be easily removed.

Hereinafter, the present disclosure will be described in more detail through Exemplary Embodiments, but Exemplary Embodiments below are for illustrative purposes only and are not intended to limit the scope of the present application.

Exemplary Embodiment 1

A polishing slurry (w/TFF) was prepared by classifying the ceria slurry by the TFF method using a polyethersulfone (PES) plate-type membrane filter with 100 nm pores and a magnetic levitation pump (BPS-iF300, Levitronix, Switzerland). At this time, the membrane filter was a TFF membrane cell unit having a size including a length of 80 mm and a width of 40 mm (CF402A cell base, STERLITECH, USA).

Exemplary Embodiment 2

After polishing a 4 cm×4 cm $SiO_2$ wafer using the polishing slurry according to Exemplary Embodiment 1 above, it was cleaned. At this time, the polishing device used was Poli-400 (GnP technology, Korea), the pad was a polyurethane CMP pad (IC1000, Dupont, USA), and the cleaning process was performed using a water jet after polishing.

At this time, detailed conditions used for polishing and cleaning are shown in [Table 1] below.

TABLE 1

| Parameters | Polishing | Cleaning |
|---|---|---|
| Head pressure (psi) | 3 | 1.5 |
| Head speed (RPM) | 101 | 101 |
| Platen speed (RPM) | 100 | 100 |
| Flow rate (ml/min) | 120 | 360 |
| Polishing time (s) | 60 | 20 |
| Liquid | Ceria slurry (wo/TFF, w/TFF) | Deionized water |

Comparative Embodiment 1

A polishing slurry (wo/TFF, NFF) was prepared using a conventional NFF method.

Comparative Embodiment 2

After polishing the wafer using the polishing slurry according to Comparative Embodiment 1 above, it was cleaned.

Experimental Embodiment 1

FIGS. 7A, 7B and 8 are graphs of polishing slurries according to Exemplary Embodiment and Comparative Embodiment above.

Referring to FIGS. 7A, 7B and 8, the polishing slurry according to Exemplary Embodiment above (w/TFF) and the polishing slurry according to Comparative Embodiment above (wo/TFF) have similar aspects in differential intensity, pH, zeta potential, etc. However, the normalized concentration before performing the tangential flow filtration method (before TFF) and the normalized concentration after performing the tangential flow filtration method (after TFF) show a large difference for the small-sized particles. Through this, it can be confirmed that the polishing slurry according to Exemplary Embodiment above and the polishing slurry according to Comparative Embodiment above do not have a significant difference in the CMP process performance, but there is a difference in the removal efficiency of the small-sized abrasive particles during cleaning after the CMP process.

Experimental Embodiment 2

FIGS. 9A and 9B are graphs related to the number of particles remaining in the polishing target material after performing a polishing method using the polishing target material, and FIGS. 10A and 10B are graphs related to polishing methods according to Exemplary Embodiment and Comparative Embodiment above. Specifically, FIG. 9A is the number of polishing slurry particles remaining on the wafer surface before cleaning, and FIG. 9B is the number of polishing slurry particles remaining on the wafer surface after cleaning.

Referring to FIGS. 9A, 7B and 10, when a wafer is polished using a collection of abrasive particles having a size of less than 200 nm, abrasive particles of various sizes may remain on the surface of the wafer. It can be confirmed that even if the wafer is cleaned in order to remove the remaining abrasive particles, small-sized abrasive particles (e.g., abrasive particles of 70 nm or less) may remain on the surface of the wafer.

That is, when the polishing method using a conventional polishing slurry (Comparative Embodiment 2) is performed, small-sized abrasive particles and large-sized abrasive particles may coexist on the polished $SiO_2$ wafer. However, even if the polished wafer is cleaned, the small-sized abrasive particles, specifically, abrasive particles having a size of 50 to 80 nm or less may remain on the wafer.

However, when the polishing method using the polishing slurry according to the present application (Exemplary Embodiment 1) is performed, it may facilitate removal (cleaning rate) of the abrasive particles remaining on the wafer after polishing while having a polishing rate (material removal rate) similar to that of the conventional polishing method.

Experimental Embodiment 3

FIG. 11 is a graph related to the resistivity of a membrane filter according to Exemplary Embodiment of the present application, and FIG. 12 is a graph related to the velocity of abrasive particles passing through the pores of the membrane filter of Exemplary Embodiment of the present application.

Referring to FIG. 11, as the pores of the membrane filter become smaller, the slope of the graph decreases, and through this, it can be confirmed that the resistivity ($R_M$) value of the membrane filter decreases.

In this regard, referring to Equation 4 above, the unit of $R_M$ is 1/m, and the slope of FIG. 11 is $m^2$ sec/kg. At this time, as mentioned in Equation 4 above, if the slope of FIG. 11 is multiplied by the viscosity (constant) and the reciprocal is taken, it can be confirmed that it is consistent with the unit of $R_M$, and at this time, the reciprocal of the density may also be multiplied depending on the dimension of the unit.

Referring to FIG. 12, it can be confirmed that as the size of the pores increases, the velocity of the abrasive particles, that is, the permeate flux increases.

Specifically, it can be confirmed that when the viscosity and the transmembrane pressure ($\Delta P$) are constant, the value of $R_M$ decreases as the size of the pores increases, and $R_L(t)$ decreases as the size of the pores increases. That is, referring to Equation 1, as the size of the pores increases, $V_F(t)$ increases.

In particular, in the case of the TFF method filter of FIG. 2 (Exemplary Embodiment) rather than the NFF method filter of FIG. 3 (Comparative Embodiment), the flow of the fluid containing the large-sized abrasive particles and small-sized abrasive particles when the polishing slurry is prepared by the TFF method may remove the cake layer formed on the membrane surface or interfere with the formation of the cake layer so that the passing speed of the small-sized abrasive particles may converge to a constant value over time.

The foregoing description of the present application is for illustration, and those with ordinary skill in the art to which the present application pertains will be able to understand that it can be easily modified into other specific forms without changing the technical spirit or essential features of the present application. Therefore, it should be understood that the embodiments described above are illustrative in all respects and not restrictive. For example, each element described as a single form may be implemented in a dispersed form, and likewise, elements described in the dispersed form may also be implemented in a combined form.

The scope of the present application is indicated by the claims to be described later rather than the above-detailed description, and all changes or modified forms derived from the meaning and scope of the claims and equivalent concepts thereof should be construed as being included in the scope of the present application.

What is claimed is:

1. A method for preparing a polishing slurry, the method comprising steps of:
preparing a solution containing abrasive particles and a fluid;
passing the solution through a porous membrane filter region in a direction perpendicular to a filtering direction of the porous membrane filter; and
preparing a polishing slurry by removing the fluid from the solution that has passed through the region, wherein in the step of passing the solution through the region, any one of the abrasive particles with a mean particle size of 100 nm or less is removed by a tangential flow filtration method, and
wherein a pressure difference between an inside and an outside of the porous membrane filter is 10 to 50 bars.

2. The method of claim 1, wherein a velocity $V_F(t)$ of the abrasive particles contained in the fluid that has passed through the porous membrane filter among the abrasive particles is determined according to the following Equation 1:

$$V_F(t) = \frac{\Delta P}{\eta \times (R_M + R_L(t))} \qquad \text{[Equation 1]}$$

In Equation 1,
$\Delta P$ is the pressure difference between the inside and the outside of the porous membrane filter, $\eta$ is a viscosity of the solution, $R_M$ is a resistivity ($m^{-1}$) of the porous membrane filter, $R_L(t)$ is a resistance ($m^{-1}$) of a filter cake layer generated as the solution passes through the porous membrane filter, and t is a time.

3. The method of claim 1, wherein the polishing slurry contains other ones of the abrasive particles with a mean particle size of 100 nm or more.

4. The method of claim 1, wherein in the step of passing the solution through the region, any one of the abrasive particles with a mean particle size of 60 nm or less is removed by the tangential flow filtration method.

5. The method of claim 1, wherein the abrasive particles have a mean particle size of 1 to 200 nm before passing the solution through the porous membrane filter region.

6. The method of claim 1, wherein the abrasive particles removed by the tangential flow filtration method have a mean particle size smaller than that of the polishing slurry.

7. The method of claim 1, wherein the porous membrane filter has pores of 30 to 200 nm.

8. The method of claim 1, wherein the abrasive particles include one selected from the group consisting of ceria ($CeO_2$), alumina ($Al_2O_3$), silicon carbide (SiC), diamond, zirconia ($ZrO_2$), and combinations thereof.

9. The method of claim 1, wherein the fluid includes one selected from the group consisting of ethanol, deionized water, methanol, and combinations thereof.

10. The method of claim 1, wherein the porous membrane filter includes one selected from the group consisting of polyethersulfone (PES), polyvinylidene fluoride (PVDF), polytetrafluoroethylene (PTFE), polysulfone, and combinations thereof.

* * * * *